(12) United States Patent
Raab

(10) Patent No.: US 6,868,359 B2
(45) Date of Patent: Mar. 15, 2005

(54) METHOD AND SYSTEM FOR CAD ENGINE INDEPENDENCE

(75) Inventor: Simon Raab, Maitland, FL (US)

(73) Assignee: Faro Technologies, Inc., Lake Mary, FL (US)

(*) Notice: Subject to any disclaimer, the term of this patent is extended or adjusted under 35 U.S.C. 154(b) by 51 days.

(21) Appl. No.: 10/391,321

(22) Filed: Mar. 18, 2003

(65) Prior Publication Data

US 2003/0233199 A1 Dec. 18, 2003

Related U.S. Application Data

(60) Provisional application No. 60/366,323, filed on Mar. 20, 2002.

(51) Int. Cl.$^7$ ............................................. G06F 15/00
(52) U.S. Cl. ................................................... 702/150
(58) Field of Search ................... 702/94, 95, 150–153, 702/155; 700/182, 194, 195

(56) References Cited

U.S. PATENT DOCUMENTS

| | | | |
|---|---|---|---|
| 5,402,582 A | 4/1995 | Raab | 332/503 |
| 5,584,016 A | 12/1996 | Varghese et al. | 700/97 |
| 5,978,748 A | 11/1999 | Raab | 702/150 |

FOREIGN PATENT DOCUMENTS

| | | |
|---|---|---|
| EP | 0 789 289 A | 8/1997 |
| EP | 1 136 897 A | 9/2001 |

*Primary Examiner*—Michael Nghiem
(74) *Attorney, Agent, or Firm*—Cantor Colburn LLP

(57) ABSTRACT

An exemplary embodiment is a system providing CAD engine independence for a coordinate measurement system. The system includes an interface between a coordinate measurement system application and a CAD engine application. The interface is specific to the CAD engine application and allows a single coordinate measurement system application to be interfaced to one or more CAD engines without the dependency of hard coding to a particular CAD engine.

16 Claims, 4 Drawing Sheets

METHOD AND SYSTEM FOR CAD ENGINE INDEPENDENCE

CROSS-REFERENCE TO RELATED APPLICATIONS

This application claims the benefit of U.S. provisional patent application Ser. No. 60/366,323 filed Mar. 20, 2002, the entire contents of which are incorporated herein by reference.

BACKGROUND

The invention relates in general to coordinate measurement machines (CMMs) and in particular to a method and system for assisting a user taking measurements using a CMM.

The manufacturing/industrial marketplace took on a new face during the 1980's with the introduction of computer-aided design (CAD) and computer-aided manufacturing (CAM). While CAD allowed engineers to produce 3-D images in the front end of the design process, which shortened the production cycle and led to tremendous gains in productivity, CAM software and equipment increased the efficiency and quality of machined single parts. In essence, these new technologies revolutionized the marketplace by increasing productivity, improving quality, and reducing costs. Despite these technological advances in design and manufacturing, something important was missing from the production cycle: a highly accurate, efficient, and convenient measurement methodology for ensuring that the products and components—both on and off the production line—met the original CAD specifications. The design process, with the help of CAD, had become innovative and sophisticated; so too, had the machining process through CAM. Yet measuring the assemblies made of these parts against the CAD model, for the most part, has continued to remain unwieldy, expensive, and unreliable.

Traditionally, the measurement and quality inspection function in the manufacturing process has been time-consuming and limited in size, scope, and effectiveness for a number of reasons. Manual measurement tools, such as calipers and scales may be slow, imprecise, and always one-dimensional. Analog test fixtures are costly and inflexible. And standard stationary CMMs while providing a high degree of precision, are generally located in quality control labs or inspection departments at a distance from the manufacturing floor. Parts must be removed one at a time and transported to the lab for inspection. As a result, CMMs measure only small, readily-moved subassemblies and components—which often translates into significant "down time" for the production line. In essence, traditional measurement techniques—also known as metrology—have lagged far behind in the technological advance of the production process.

The CAD/CAM and metrology markets, as well as a worldwide emphasis on quality in all aspects of the manufacturing process, are driving the need for an extension of the CAD/CAM techniques, which the inventor refers to as computer-aided manufacturing measurement. Computer-aided manufacturing measurement is CAD-based total quality assurance technology. This last phase of the CAD revolution has remained incomplete because of the significant technical demands for adaptive measurement hardware and usable CAD-based measurement software for the difficult manufacturing environment. Computer-aided manufacturing measurement takes conventional metrology from a single-parts-only, high-level precision testing methodology—behind the door of the quality control lab—to a whole products, intermediate-level precision measurement system at every step of the manufacturing process—at any location on the factory floor. Measurements of part dimensions and/or characteristics may be made on the production floor to determine compliance with specifications and ensure quality.

FIG. 1 is a diagrammatic view of a conventional, portable CMM 10 comprised of a manually operated multi-jointed arm 12 and a support base or post 14, a serial box 16 and a host computer 18. It will be appreciated that arm 12 electronically communicates with serial box 16 which, in turn, electronically communicates with host computer 18. Additional detail of the conventional three-dimensional measuring system can be found in U.S. Pat. No. 5,402,582, the contents of which are incorporated herein by reference.

An improvement to the three dimensional coordinate measuring system of FIG. 1 is described in U.S. Pat. No. 5,978,748, the contents of which are incorporated herein by reference. This patent discloses a system in which a controller is mounted to the arm and runs an executable program which directs the user through a process such as an inspection procedure. In such a system, a host computer may be used to generate the executable program. The controller mounted to the arm is used to run the executable program but cannot be used to create executable programs or modify executable programs. By way of analogy to video gaming systems, the host computer serves as the platform for writing or modifying a video game and the arm mounted controller serves as the platform for playing a video game. The controller (e.g., player) cannot modify the executable program. As described in U.S. Pat. No. 5,978,748, this results in a lower cost three dimensional coordinate measurement system by eliminating the need for a host computer for each articulated arm.

A coordinate measurement system application may perform operations against CAD models to compare the actual part being measured to the nominal CAD values. Since CAD models may be generated in numerous formats that are unique from vendor to vendor and sometimes protected by encryption, translation from one format to another is difficult, unreliable, time consuming and/or costly. The majority of the market is currently dominated by at least six CAD formats. In the normal course of performing operations, CAD data must be translated from its original CAD format to the coordinate measurement system application and stored internally in its disassociated format. This process requires translation of the data. Translation of data often results in certain data imperfections, and may not be possible at all due to translator idiosyncrasies and changes in CAD engine formats. Such a result is undesirable because the translated data may be unreliable and unusable.

This problem has been addressed through the creation of specific coordinate measurement system applications that integrate into the CAD engine. Although this may address the translation issues, it creates a problem because a software provider is forced to serve only the users of the particular CAD engine, or to rely on translators written for the specific CAD engine. In the later instance, the translation problem is again an issue.

There is a need, therefore, for a method and system for a CAD engine independent tool for users of coordinate measurement systems. Such a method and system would render the coordinate measurement system more versatile and readily adaptable to computer-aided manufacturing measurement.

SUMMARY

An exemplary embodiment is a system and method for CAD engine independence. The system includes an interface between a coordinate measurement system application and a CAD engine application. The interface is specific to the CAD engine application and allows for a single (e.g., generic) coordinate measurement system application to be interfaced to one or more CAD engines without the dependency of hard coding to a particular CAD engine.

BRIEF DESCRIPTION OF THE DRAWINGS

Referring now to the drawings wherein like elements are numbered alike.

DETAILED DESCRIPTION

An embodiment for a method and system for CAD engine independence includes software formatted to be independent of a CAD engine. This allows a coordinate measurement system application to be compiled with an OPEN interface. Note that a NON-OPEN interface requires hard coding to a particular CAD engine. Thus, in such a NON-OPEN system, a measurement interface for a different CAD engine would require a different hard code. However, an embodiment having an OPEN interface does not require hard coding to a CAD engine. For example, the OPEN interface measurement application does not require a particular version of a CAD engine to operate. In the OPEN system, an interface may be created between the CAM application and the CAD engine. This allows the coordinate measurement system application to be operated directly on the CAD files. CAD engine independence allows the coordinate measurement system application to operate independently from the CAD engine, so that any CAD engine may be used as the coordinate measurement system application's engine.

Figure 1:
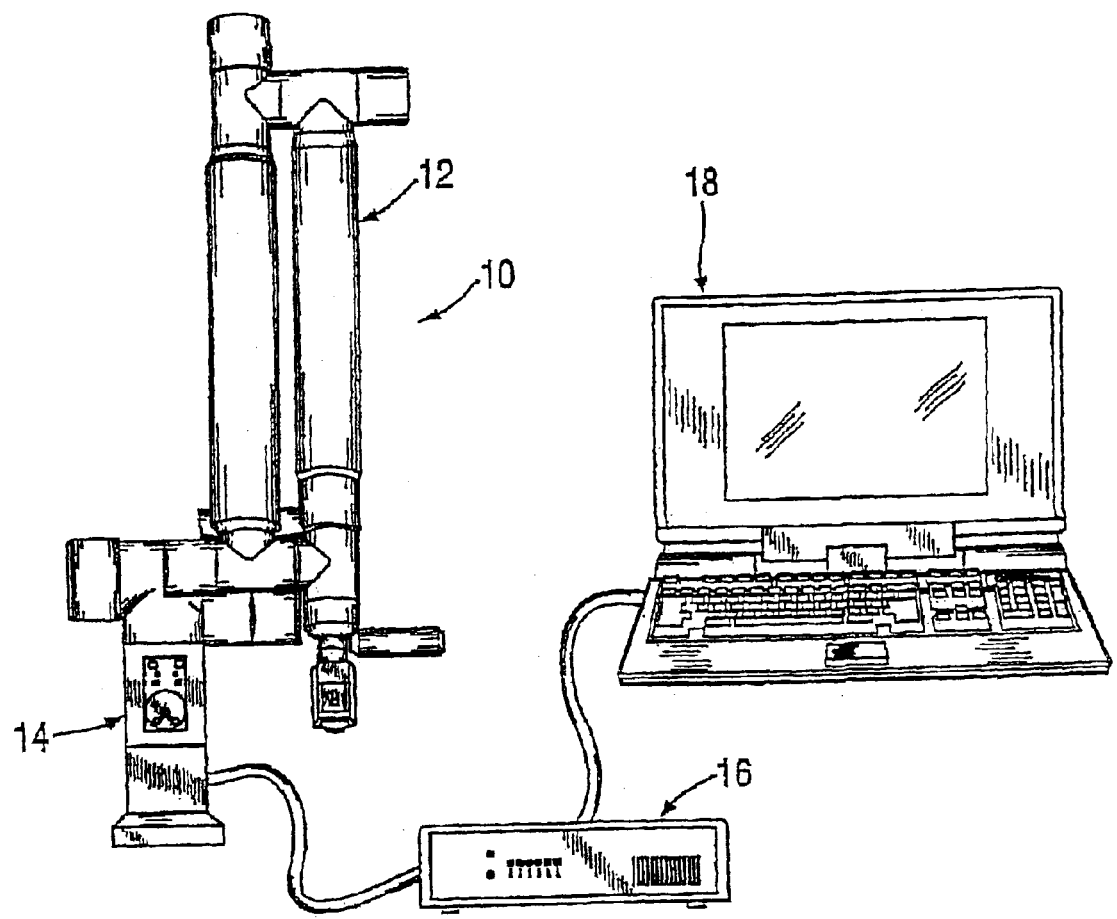
FIG. 1 is a diagrammatic view of a conventional coordinate measurement system.
Figure 2:
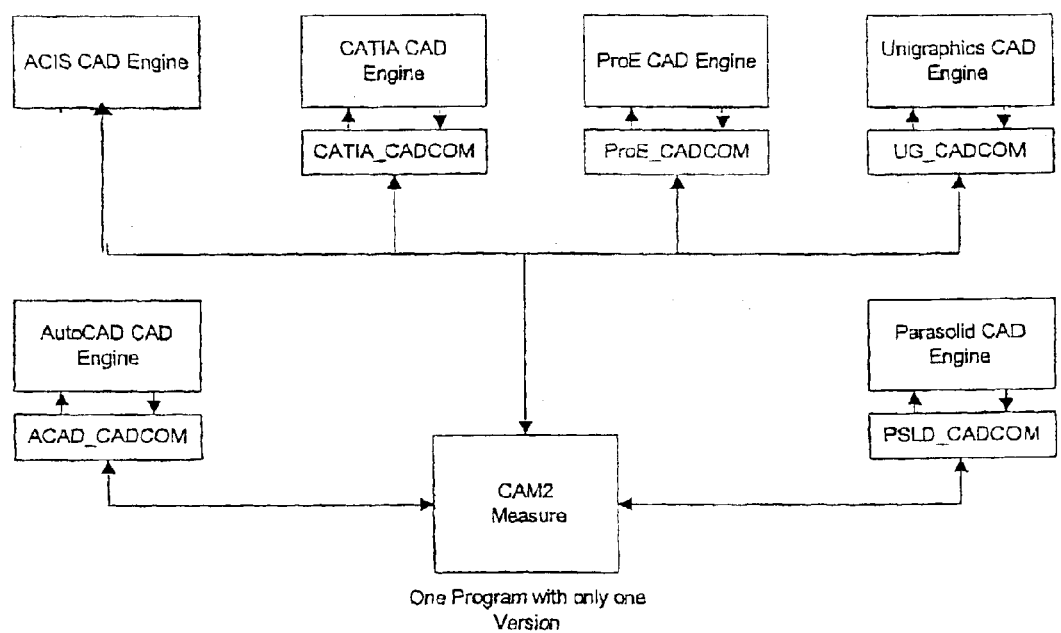
FIG. 2 is a block diagram of a coordinate measurement system application in an embodiment of the invention.

Referring to FIG. 2, in one embodiment, the coordinate measurement system application (shown as CAM2 Measure) may communicate to an intermediary application (referred to herein as CADCOM). Thus, only one version of the coordinate measurement system application is used along with customized CADCOM components that are for individual CAD systems. Thus, only a single code base is designed, developed and maintained. In another embodiment, the coordinate measurement system application may be compiled into an engine, for example, a coordinate measurement system measure engine. In this example, the coordinate measurement system measurement application may interface directly to an ACIS CAD engine without translation, because the engine is compiled from an ACIS toolkit and requires no intermediary application (e.g., CADCOM.dll).

Figure 3:
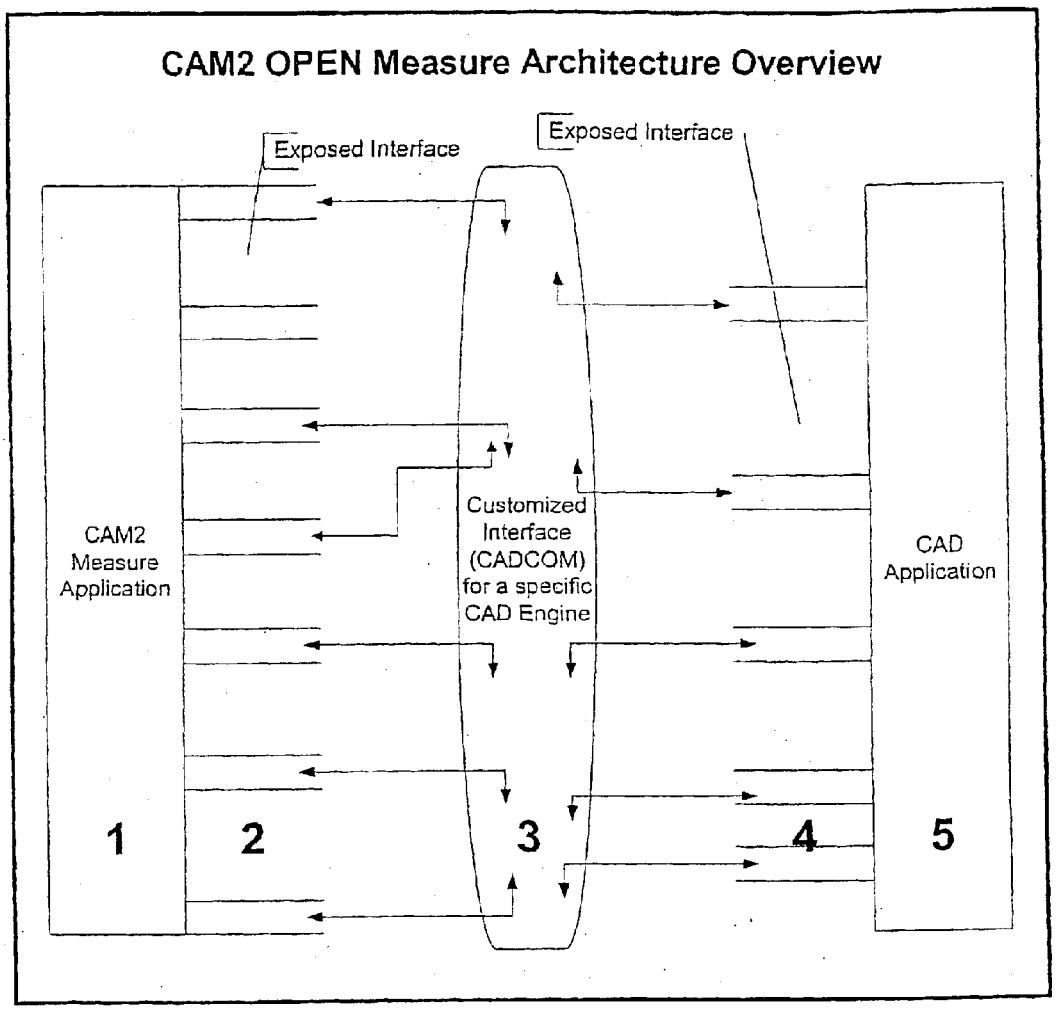
FIG. 3 is a block diagram of a software architecture in an embodiment of the invention.

Referring to FIG. 3, when the coordinate measurement system application (1) is interfaced to a new CAD engine (5), the details of the CAD engine's interface (4) are obtained. This interface (4) may be specific to each CAD Engine (5). Interface requirements (2) (also referred to herein as open measure interface) are reviewed. While the CAD engine (5) and its interface (4) are unique to each implementation of the system for a target CAD engine, coordinate measurement system application (1) and the open measure interface (2) remain the same. Next code is created for the intermediary application (3) (also referred to herein as CADCOM) between the coordinate measurement system application (1) and the CAD engine (5).

Figure 4:
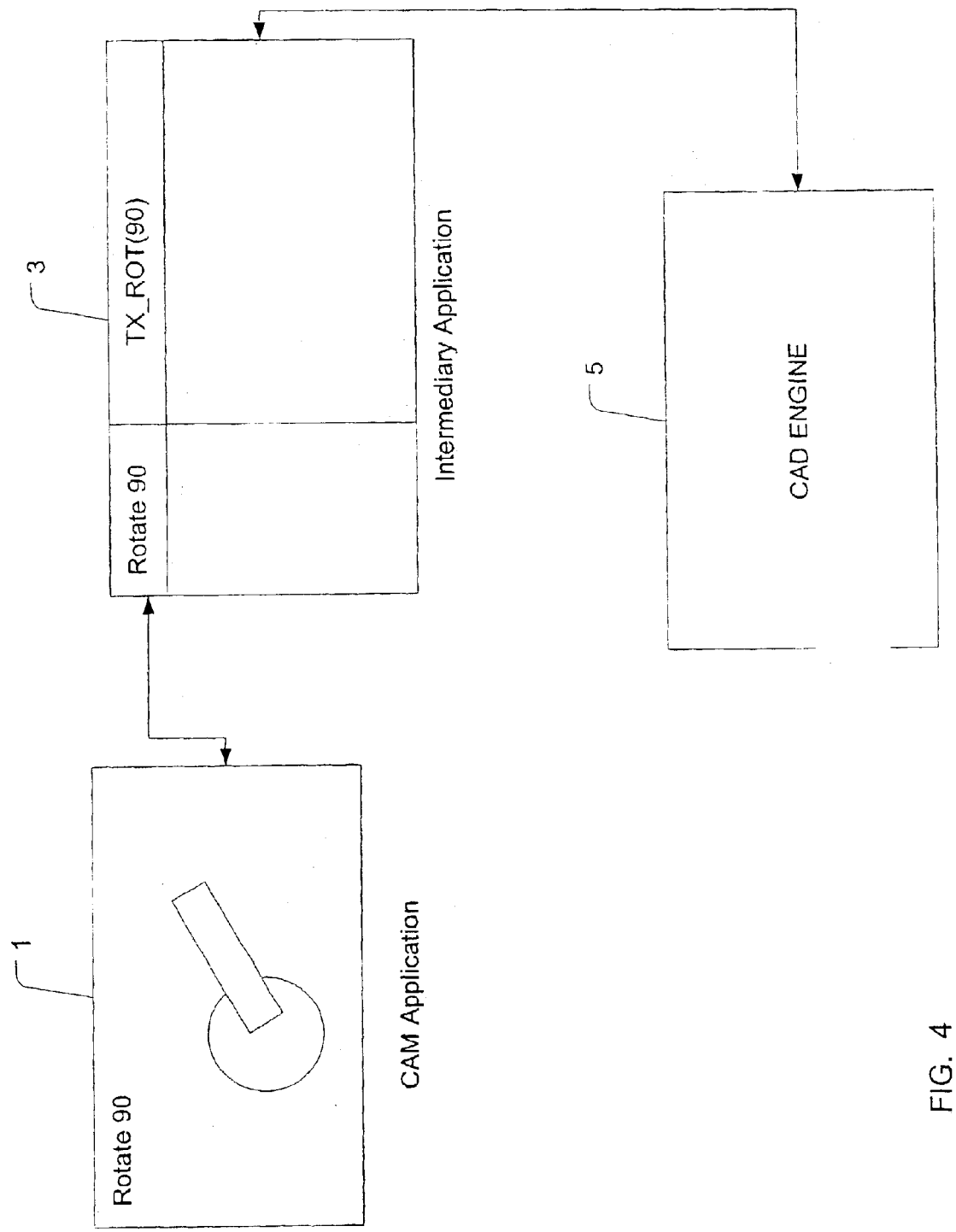
FIG. 4 illustrates translation of a command from the coordinate measurement system application to the CAD engine format.

FIG. 4 illustrates conversion of a command from the coordinate measurement system application to the CAD engine application using the intermediary application. As shown in FIG. 4, the intermediary application 3 converts commands from the coordinate measurement system application 1 to the CAD engine 5 format. In the example shown in FIG. 4, the user has selected a "Rotate 90" command in the coordinate measurement system application to rotate the displayed part by 90 degrees. To perform the rotation, the CAD engine 5 needs to generate an updated visualization of the part. The rotate command is provided to the intermediary application 3 where the command in the coordinate measurement system application format is converted to a CAD engine format. The command in the CAD engine format is then submitted to CAD engine 5 for processing. The updated visualization of the part is provided back to the coordinate measurement system application 1 for display to the user.

As described above, an intermediary application 3 may be created for each CAD engine format providing the coordinate measurement system application independence from the CAD engine formats. Although a coordinate measurement system application directed to measurement has been described as an exemplary application, it is understood that the intermediary application may be used regardless of the coordinate measurement system function being performed. For example, the coordinate measurement system application may be a reporting function that requires CAD data for providing visual reports of parts and statistical measurements. The intermediary application 3 would serve to interface the coordinate measurement system reporting application 1 with the CAD engine 5 as needed.

The intermediary application 3 may be created by a programmer creating a translation table of commands in the coordinate measurement system application to commands in the CAD engine format. The coordinate measurement system application 1 commands that require some action by the CAD engine 5 are indexed to the appropriate CAD engine 5 command. When a command is received from the coordinate measurement system application 1, the appropriate CAD engine 5 command is retrieved and forwarded to the CAD engine 5.

Most CAD engines provide an application programming interface (API) that allows other programs to interact with the CAD engine. However, the manner of accessing each API and the commands used vary across CAD engines. This information is contained in each intermediary application 3 defining an entry point to the CAD engine API. As shown in FIG. 4, the intermediary application 3 also contains the commands in the coordinate measurement system format and the corresponding command in the CAD engine format. Thus, the intermediary application submits the appropriate CAD engine command to the appropriate CAD engine API based on the coordinate measurement system command.

An exemplary embodiment for functions that may be implemented in the intermediary application 3 are described below. The function calls from the coordinate measurement system application 1 to the CAD engine 5 may be varied. For example, measurement functions request measurement of some feature on a CAD part. Viewing functions request a change in the current view of a CAD part. Construction functions allow for the creation and/or deletion of CAD elements. Exemplary functions supported by the coordinate measurement system application and the intermediary application are listed below.

CenterViewTool: Prompts the user to pan the current view dynamically with a mouse. Each time the user presses the left mouse button, the view will center on the location of the mouse. If the user hits "ESC" or the right mouse button, this method will return.

CreateAngle: Creates an angle dimension. A Return Value returns the id of the dimension created if successful; otherwise returns NULL. The parameters are the apex of the angle, the first end point of the angle and the second end point of the angle.

CreateArc: Creates an arc entity. A Return Value returns the id of the arc created if successful; otherwise NULL. The parameters are the start location of the arc, the second point on the arc and the end location of the arc. This creates an arc passing through three points. If the points are collinear, this method will fail.

CreateCircle: Creates a circle entity. A Return Value returns the id of the circle created if successful; otherwise NULL. The parameters are the center of the circle, the plane normal vector of the circle and the diameter of the circle.

CreateCone: Creates a cone entity. A Return Value returns the id of the cone created if successful; otherwise NULL. The parameters are the apex of the cone, the center of the base of the cone and the diameter at the base of the cone.

CreateCylinder: Creates a cylinder entity. A Return Value returns the id of the cylinder created if successful; otherwise NULL. The parameters are the position of one end of the axis of a cylinder, the position of the other end of the axis of a cylinder and the diameter of the cylinder.

CreateDistance: Creates a distance dimension entity. A Return Value returns the id of the dimension created. The parameters are one end of the dimension and the other end of the dimension.

CreateEllipse: Creates an ellipse entity. A Return Value returns the id of the ellipse created. The parameters are the center of the ellipse, the plane normal vector of the ellipse, the major axis vector of the ellipse, the minor axis ellipse diameter and the major axis ellipse diameter.

CreateLabel: Creates a label entity. A label entity may be text with a variable length leader line. A Return Value returns the id of the label created. The parameters are the labels text, the leader line (polyline), the label's font, the font size and the color of the font.

CreateLayer: Creates a new layer. The parameters are the name of the layer to create and the color associated with the new layer.

CreateLine: Creates a line entity. A Return Value returns the id of the line created. The parameters are the first point on the line and the second point on the line.

CreatePlane: Creates a plane entity. A Return Value returns the id of the plane created. The parameters are the centroid of the plane, the left corner of the plane and the right corner of the plane.

CreatePoint: Creates a point entity. A Return Value returns the id of the point created. The parameters are the position of the point.

CreatePolyline: Creates a polyline from an array of points. A Return Value returns the id of the polyline created. The parameters are the points that define the polyline. If TRUE, the polyline is a closed polyline.

CreateRoundSlot: Creates a round slot entity. A Return Value returns the id of the round slot created. The parameters are the vector of a round slot from the center of the first Arc to the center of the second arc, the plane normal vector of the round slot, the center of the slot, the length from the center of the first arc to the center of the second arc and the diameter of each arc.

CreateSphere: Creates a sphere entity. A Return Value returns the id of the sphere created. The parameters are the center of the sphere and the diameter of the sphere.

CreateSpline: Creates a spline entity. A Return Value returns the id of the spline created. The parameters are an array of points used to define the spline. TRUE if the spline is closed.

CreateText: Creates a text entity on the screen. A Return Value returns the id of the text created. The parameters are the position of the text, the text to display on the screen, the font of the text and the size of the font.

CreateToroid: Creates a toroid entity. A Return Value returns the id of the toroid created. The parameters are the center of the toroid, the center of the tube at one end of the toroid, the center of the tube at the other end of the toroid and the diameter of the tube.

CreateUcs: Creates a User coordinate system entity. A Return Value returns the id of the UCS created. The parameters are the origin of the new Ucs, a point on the X axis and a point in the xy plane.

DeleteLabels: Deletes all label entities. A Return Value returns TRUE if successful.

DeleteXDataDouble: Removes the specified extended data of type double from an entity. A Return Value returns TRUE if the extended data was found and deleted. The parameters are the entity and the identifier of the extended data.

DeleteXDataDoubleA: Removes the specified extended data of type double array from an entity. A Return Value returns TRUE if the extended data was found and deleted. The parameters are the entity and the identifier of the extended data.

DeleteXDataHandle: Removes the specified extended handle data from an entity. A Return Value returns TRUE if the extended data was found and deleted. The parameters are the entity's id and the identifier of the extended data.

DeleteXDataLong: Removes the specified extended data of type long from an entity. A Return Value returns TRUE if the extended data was found and deleted. The parameters are the entity's id and the identifier of the extended data.

DeleteXDataMat4: Removes the specified extended CMatrix4 data from an entity. A Return Value returns TRUE if the extended data was found and deleted. The parameters are the entity's id and the identifier of the extended data.

DeleteXDataNamedString: Removes the specified extended string data from an entity. A Return Value returns TRUE if the extended data was found and removed. The parameters are the entity's id and the identifier of the extended data.

DeleteXDataNamedStrings: Removes the specified extended string array data from an entity. A Return Value returns TRUE if the extended data was found and deleted. The parameters are the entity's id and the identifier of the extended data.

DeleteXDataString: Removes the specified extended string data from the entity. A Return Value returns TRUE if the extended data was found and deleted. The parameters are the entity's id and the identifier of the extended data.

DeleteXDataVec3: Removes the specified extended CVec3 data from the entity. A Return Value returns TRUE if the extended data was found and deleted. The parameters are the entity's id and the identifier of the extended data.

DistPointFace: Calculates the distance from a point to a surface. A Return Value returns the distance from the point to the surface. The parameters are a point and a surface. Parameter "bReverseNormal" reverses the direction of the Normal vector if TRUE, "Distance" returns the distance from the point to the surface and "ClosestPoint" returns the closest point to the given surface.

DrawLine: Draws a line on the screen. This line is temporary. If the screen is re-drawn, it will not be re-drawn. The parameters are the first point on the line and the second point on the line. If "bAllViews" is TRUE, the line will be drawn in all views, otherwise it is drawn only in the active view. If "bDotted" is TRUE, the line should be dotted, otherwise the line is a solid line.

DrawPolyLine: Draws a polyline on the screen. This polyline is temporary. If the screen is re-drawn, it will not be re-drawn. The parameters are the points that define the polyline. If "bAllViews" is TRUE, the line will be drawn in all views, otherwise it is drawn only in the active view.

DuplicateEntities: Makes a copy of the selected entities. A Return Value returns TRUE if the copy was successful. The parameters are an array of entity ids to be duplicated. "DestinationEntities" returns the array of new entity ids.

DynamicPan: Prompts the user to pan the view dynamically with the mouse.

Entity2Handle: A Return Value returns TRUE if a handle was created/found. The parameters are the Id of the Entity. If "bCreate" is TRUE, will create the handle if it does not exist, else looks for an existing handle. "Handle" returns the handle of the Entity. "Time" returns the time the session started.

EraseEntity: Erases the specified entity. A Return Value returns TRUE if successful. The parameters are the entity to erase.

EvaluateNormal: Retrieves the normal of a surface at a specified location. A Return Value returns TRUE if successful. The parameters are the surface entity to evaluate and the point on the surface. "Normal" returns the normal evaluated at the surface for the given point.

Face2Body: Retrieves the id of the body the face belongs. A Return Value returns the id of the parent body. The parameters are the entity id for the face.

FileSaveAs: Saves the current drawing as the name provided. A Return Value returns TRUE if the drawing was saved successfully. The parameters are the name of the drawing file used.

FileSaveAsWithPrompt: Saves the current drawing using the standard file save as dialog. A Return Value returns TRUE if the save was successful. The parameters are name of the drawing file.

FindClosestPointToEdge: A Return Value returns TRUE if successful. The parameters are the entity id and point. "ClosestPoint" returns the point found closest to the entity edge.

"Normal" returns the normal of the closest point. "Tangent" returns the vector tangent to the edge through the closest point.

GetActiveToWorldTransform: Retrieves the active UCS to World UCS transformation matrix. The parameters are "Mat"—will hold the resulting transformation matrix.

GetBoundingBox: Retrieves a bounding box for a given face. The parameters are the face id. "TopRight" returns the top right corner of the bounding box. "BottomLeft" returns the bottom left corner of the bounding box. TRUE if the bounding box was determined.

GetColor: Retrieves the current color of an entity. A Return Value returns Returns the color of the specified entity. The parameters are the entity.

GetCurrentFilePath: Retrieves the document's current file path. A Return Value returns the current file path.

GetCurrentLayer: Retrieves the name of the current layer. A Return Value returns the name of the current layer.

GetCurrentState: Retrieves the current state of the part. A Return Value returns the current state.

GetCurrentUCS: Retrieves the id of the current UCS. A Return Value returns the id of the current UCS.

GetDefaultPath: Retrieves the document's default file path. A Return Value returns the default path.

GetDrawingVersion: Retrieves the current drawing version. A Return Value returns the drawing version.

GetEntityFromGroup: Retrieves an entity from the given group by index. A Return Value returns the entity at the index specified for the given group. The parameters are the index of the entity to return and the Id of the group.

GetEntityList: Retrieves a list of all entity ids. "EntList" returns the list of entity ids.

GetFaceList: Retrieves a list of all face ids for a given entity list. The parameters are the list of entity ids. "FaceList" returns the list of face ids.

GetGeometryArc: Retrieves geometry information from an arc entity. A Return Value returns TRUE if the entity is an arc. The parameters are the arc. "Center" retrieves the center of the arc. "Diameter" retrieves the diameter of the arc. "StartAngle" retrieves the start angle of the arc. "EndAngle" retrieves the end angle of the arc. "Normal" retrieves the normal vector of the arc. "Point1" retrieves the start point of the arc. "Point2" retrieves the end point of the arc.

GetGeometryCircle: Retrieves geometry information from a circle entity. A Return Value returns TRUE if the entity is a circle. The parameters are the circle. "Center" retrieves the center of the circle. "Normal" retrieves the normal vector of the circle. "Diameter" retrieves the diameter of the circle.

GetGeometryEllipse: Retrieves geometry information from an ellipse entity. A Return Value returns TRUE if the entity is an ellipse. "Center" retrieves the center of the ellipse. "Normal" retrieves the normal vector of the ellipse. "MajorAxis" retrieves the normal major axis vector of the ellipse. "MajorR" retrieves the radius of the major axis. "MinorR" retrieves the radius of the minor axis.

GetGeometryLine: Retrieves geometry information from a line entity. A Return Value returns TRUE if the entity is a line. The parameters are the line. "Point1" retrieves the start point of the line. "Point2" retrieves the end point of the line.

GetGeometryPoint: Retrieves geometry information from a point entity. A Return Value returns TRUE if the entity is a point. The parameters are the point. "Point" retrieves the position of the point.

GetGroup: Retrieves the parent group for a given entity. A Return Value returns the id of the group. The parameters are the entity's id.

GetGroupCount: Retrieves the group count for a given entity. A Return Value returns the group count. The parameters are the entity's id.

GetNearestFace: Retrieves the nearest face for a given measured point. A Return Value returns TRUE if the nearest face was found, the distance calculated, and a surface point was found. The parameters are the face id, nearest face id, surface point on nearest face and the minimum distance from the surface point to the measured point. "Meas" measures point from the face. "Reverse" is TRUE if you want to reverse the face normal.

GetPickEvent: Retrieves the point from a mouse or front button click on the screen. A Return Value returns TRUE if a valid point was found at the click location. The parameters are "Point at the click location."

GetPlaneVertices: Retrieves the vertices for a given plane. A Return Value returns TRUE if the entity is a plane and has 4 corners. The parameters are the id of the plane entity and the plane vertices array and normal.

GetPolyPoints: Retrieves all of the points for a given polyline entity. A Return Value returns TRUE if the points were retrieved form the polyline. The parameters are the polyline id and the array of the polyline points GetTypeName: A Return Value returns the type of entity. The parameters are the entity's id.

GetUVCenterOfSurface: Retrieves a point on a surface. A Return Value returns TRUE if successful. The parameters are the entity's id. "Ent" returns a point on the surface.

GetViewDirections: Retrieves the current view directions. A Return Value returns TRUE if successful. The parameters are the direction of the out vector of the view and the direction of the up vector of the view.

GetViewHeight: Retrieves the current view height. A Return Value returns TRUE if successful. The parameters are the height of the view.

GetViewTarget: Retrieves the target vector of the current view. A Return Value returns TRUE if successful. The parameters are the view target vector.

GetViewWidth: Retrieves the width of the current view. A Return Value returns TRUE if successful. The parameters are the view width.

GetWorldUCS: Retrieves the id of the World UCS. A Return Value returns the id of the World UCS.

GetXDataDouble: Retrieves the specified extended data for a given entity. A Return Value returns TRUE if the extended data was found. The parameters are the entity's id, the extended data identifier and the extended data.

GetXDataDoubleA: Retrieves the specified extended data for a given entity. A Return Value returns TRUE if the extended data was found. The parameters are the entity's id, the extended data identifier and the extended data. "Size" returns the size of the array.

GetXDataHandle: Retrieves the specified extended data for a given entity. A Return Value returns TRUE if the extended data was found. The parameters are the entity's id, the extended data identifier, the extended data handle and the extended data time.

GetXDataLabels: Retrieves the specified extended data for a given entity. A Return Value returns TRUE if the extended data was found. The parameters are the entity's id, the extended data identifier and the extended data.

GetXDataLong: Retrieves the specified extended data for a given entity. A Return Value returns TRUE if the extended data was found. The parameters are the entity's id, the extended data identifier and the extended data.

GetXDataLong: Retrieves the specified extended data for a given entity. A Return Value returns TRUE if the extended data was found. The parameters are the entity's id, the extended data identifier and the extended data.

GetXDataAllNamedString: Retrieves all of the extended data for a given entity. A Return Value returns TRUE if successful. The parameters are the entity's id. "strValues" returns the extended data as an array of strings.

GetXDataNamedString: Retrieves the specified extended data for a given entity. A Return Value returns TRUE if the extended data was found. The parameters are the entity's id, the extended data identifier and the extended data.

GetXDataNamedStrings: Retrieves the specified extended data for a given entity. A Return Value returns TRUE if the extended data was found. The parameters are the entity's id, the extended data identifier and the extended data.

GetXDataString: Retrieves the specified extended data for a given entity. A Return Value returns TRUE if the extended data was found. The parameters are the entity's id, the extended data identifier and the extended data.

GetXDataVec3: Retrieves the specified extended data for a given entity. A Return Value returns TRUE if the extended data was found. The parameters are the entity's id, the extended data identifier and the extended data.

GoToState: Sets the current drawing state. The parameters are the new state of the drawing.

IsEntityUCS: Determines if the entity is a User Coordinate System. A Return Value returns TRUE if the entity is a User Coordinate System. The parameters are the entity.

IsLayerVisible: Determines if the layer is visible. A Return Value returns TRUE if successful. The parameters are the name of the layer. "bIsVisible" is TRUE if the layer is visible.

IsPolylineOpen: Determines if the polyline is open or closed. A Return Value returns TRUE if successful. The parameters are the polyline id. "bIsOpen" is TRUE if the polyline is open.

IsSurface: Determines if the entity is a surface. A Return Value returns TRUE if the entity is a surface. The parameters are the entity to check.

LabelTool: Starts the label creation process. The parameters are the name of the label, the starting point for the label's leader line, the type of font, the size of the font and the color of the label.

LineTool: Starts the line creation process. The parameters are the starting point of the new line.

MirrorEntities: Mirrors the selected entities about the plane. A Return Value returns TRUE if the entities were mirrored. The parameters are the normal of the mirror plane, a point on the mirror plane and an array of entity ids to be mirrored.

MoveCameraTool: Prompts the user to rotate the view in 3d. Continues to rotate the view until the user presses any mouse button or "ESC".

Name: Retrieves the name of the CAD Engine. A Return Value returns TRUE if successful. The parameters are "Name" which returns the name as a string.

NewDrawing: Opens a new drawing. If "bDiscardOld" is TRUE, discard the current drawing without prompting the user to save. If FALSE and the user has not saved the current drawing, prompt the user to save the drawing.

NoteState: Everything between a StartState and NoteState method will be saved as a single undo state. The parameters are the state.

OpenDrawingDiscardOld: Opens the specified file. Discard the current file without prompting. A Return Value returns TRUE if successful. The parameters are the name of the file to open.

PickMultipleEntities: Retrieves all of the entities selected from the drawing. A Return Value returns the number of entities selected. "Filter" determines which entities will not be selected. "Ents" is the list of selected entities. "Event" returns the selection event.

PickPointOnSurface: Retrieves the point from a surface at the click location. A Return Value returns the surface id. The parameters are the point at the click location.

PickSingleEntity: Retrieves the entities selected from the drawing. A Return Value returns the selection event. "Filter" determines which entity will not be selected. "Point" is the point at the click location. "EntId" is the id of the entity selected.

ProjectPntToSurface: Projects a point to a surface. A Return Value returns TRUE if successful. The parameters are the point to project, the surface entity to project to and the projected point.

Prompt: Places text in the command line prompt. If "bClear" is TRUE, all messages will be cleared. If "bReplace" is TRUE, replaces the last prompt with the new prompt.

RefreshViews: Forces a redraw of all views.

Regen: Forces a regeneration of all views.

SaveAllModified: Saves all of the modified parts. A Return Value returns TRUE if successful.

SavePicture: Saves the current drawing as a metafile. A Return Value returns TRUE if successful. The parameters are the name of the file.

ScaleDrawing: Scales the current drawing by the specified amount. A Return Value returns TRUE if successful. The parameters are the scale value.

SetColor: Sets the color of the specified entity. A Return Value returns TRUE, if successful. The parameters are the entity and the color.

SetCurrentLayer: Sets the given layer as the current layer. The parameters are the layer's name. It returns TRUE if successful.

SetCurrentUCS: Sets the current UCS to the specified UCS entity. A Return Value returns TRUE if the entity is a UCS entity; otherwise FALSE. The parameters are the UCS entity to make current.

SetCurrentUnits: Sets the units of the drawing. The parameters are new units scale.

SetDefaultPath: The parameters are the new path name.

SetEntityLayer: Sets the layer of an entity. A Return Value returns TRUE if successful. The parameters are the entity and the layer name.

SetLayerVisibility: Turns the specified layer on or off. The parameters are the name of the layer. "bOn" is TRUE to turn the layer on.

SetTextFont: Changes the font of all text on the screen. A Return Value returns TRUE if there was any text on the screen. The parameters are the font name, the font size and the font color.

SetViewDirections: Sets the screen view direction. A Return Value returns TRUE if successful. The parameters are the new view direction.

SetViewHeight: Sets the height of the view. A Return Value returns TRUE if successful. Returns FALSE if there is no document open or dHeight is less than or equal to zero. The parameters are the new height of the view.

SetViewTarget: Sets the center point of the view. A Return Value returns TRUE if successful. The parameters are "Center."

SetXDataDouble: Adds or replaces extended data on an entity. A Return Value returns Returns TRUE if successful. The parameters are the entity which will hold the extended data, the extended data identifier and the extended data.

SetXDataDoubleA: Adds or replaces extended data on an entity. A Return Value returns Returns TRUE if successful. The parameters are the entity which will hold the extended data, the extended data identifier and the extended data, a double array.

SetXDataHandle: Adds or replaces extended data on an entity. A Return Value returns TRUE if successful. The parameters are the entity which will hold the extended data, the extended data identifier, the extended handle data and the extended time data.

SetXDataLong: Adds or replaces extended data on an entity. A Return Value returns TRUE if successful. The parameters are the entity which will hold the extended data, the extended data identifier and the extended data.

SetXDataMat4: Adds or replaces extended data on an entity. A Return Value returns TRUE if successful. The parameters are the entity which will hold the extended data, the extended data identifier and the extended data.

SetXDataNamedString: Adds or replaces extended data on an entity. A Return Value returns TRUE if successful. The parameters are the entity which will hold the extended data, the extended data identifier and the extended data.

SetXDataNamedStrings: Adds or replaces extended data on an entity. A Return Value returns TRUE if successful. The parameters are the entity which will hold the extended data, the extended data identifier and the extended data.

SetXDataString: Adds or replaces extended data on an entity. A Return Value returns TRUE if successful. The parameters are the entity which will hold the extended data, the extended data identifier and the extended data.

SetXDataVec3: Adds or replaces extended data on an entity. A Return Value returns TRUE if successful. The parameters are the entity which will hold the extended data, the extended data identifier and the extended data.

ShowToolBar: Displays the On-Line learn toolbar.

StartState: Everything between a StartState and NoteState method will be saved as a single undo state.

TransformEntities: Transforms the entities in the selection set by the specified matrix. A Return Value returns TRUE if successful.

TransformEntity: Transforms an entity by a matrix. A Return Value returns TRUE if successful. The parameters are the entity to transform and the transformation matrix.

TransformGraphLabels: Transforms all label entities by a matrix.

TwistViewTool: Prompts the user to twist the view about its center point. I rotates the view until the user presses a mouse button or hits the "ESC" key.

Version: Retrieves the version of the CAD Engine. A Return Value returns TRUE if successful. "Version" returns the version as a string.

XdataExists: Determines if the specified xdata tag is on this entity. A Return Value returns TRUE if the Xdata exists; otherwise FALSE.

XdataSize: Retrieves the size of the specified extended data. A Return Value returns The parameters are the entity with the extended data and the label of the extended data.

ZoomExtents: Zooms to the extents of the drawing.

ZoomIn: Zooms by the specified amount. A Return Value returns FALSE if dValue is less than or equal to zero; otherwise TRUE. The parameters are the factor by which to zoom. 2.0 will zoom in by a factor of 2. 0.5 will zoom out by a factor of 2

ZoomWindowTool: Prompts the user to select a window to zoom in on. A Return Value returns TRUE if successful. The user can cancel by hitting "ESC".

The description applying the above embodiments is merely illustrative. As described above, embodiments in the form of computer-implemented processes and apparatuses for practicing those processes may be included. Also included may be embodiments in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. Also included may be embodiments in the form of computer program code, for example, whether stored in a storage medium, loaded into and/or executed by a computer, or as a data signal transmitted, whether a modulated carrier wave or not, over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof.

What is claimed is:

1. A system for interfacing with multiple computer aided design engines, the system comprising:

a coordinate measurement system executing a coordinate measurement system application, said coordinate measurement system generating coordinate measurement system command;

a first intermediary application receiving said coordinate measurement system command and translating said coordinate measurement system command into a first computer aided design command, said intermediary application providing said first computer aided design command to a first computer aided design application;

wherein said coordinate measurement system application interfaces directly with a second computer aided design application without translating said coordinate measurement system command by said first intermediary application.

2. The system of claim 1 further comprising:

a third intermediary application for receiving the coordinate measurement system command and translating said coordinate measurement system command into a third computer aided design command, said third intermediary application for providing said third computer aided design command to a third computer aided design application.

3. The system of claim 1 wherein:

said coordinate measurement system application is a measurement application for obtaining measurements of a part.

4. The system of claim 1 wherein:

said coordinate measurement system application is a reporting application for reporting measurements of a part.

5. The system of claim 1 wherein:

said intermediary application includes an entry point for submitting said first computer aided design command to said first computer aided design application.

6. The system of claim 1 wherein:

said first computer aided design command is related to a measurement function for generating a measurement of a computer aided design part.

7. The system of claim 1 wherein:

said first computer aided design command is related to a construction function for generating a computer aided design part.

8. The system of claim 1 wherein:

said first computer aided design command is related to a viewing function for viewing a computer aided design part.

9. A method for interfacing with multiple computer aided design engines, the method comprising:

executing a coordinate measurement system application, said coordinate measurement system generating a coordinate measurement system command;

translating said coordinate measurement system command into a first computer aided design command by a first intermediary application;

providing said first computer aided design command to a first computer aided design application; and receiving a response from the computer aided design application;

wherein for a second computer aided design engine, providing said coordinate measurement system command to said second computer aided design application without translating said coordinate measurement system command by said first intermediary application.

10. The method of claim 9 further comprising:

for a third computer aided design application, translating said coordinate measurement system command into a third computer aided design command and providing said third computer aided design command to said third computer aided design application.

11. The method of claim 9 wherein:

said coordinate measurement system application is a measurement application for obtaining measurements of a part.

12. The method of claim 9 wherein:

said coordinate measurement system application is a reporting application for reporting measurements of a part.

13. The method of claim 9 wherein:

said providing said first computer aided design command to said first computer aided design application includes identifying an entry point for submitting said first computer aided design command to said first computer aided design application.

14. The method of claim 9 wherein:

said first computer aided design command is related to a measurement function for generating a measurement of a computer aided design part.

15. The method of claim 9 wherein:

said first computer aided design command is related to a construction function for generating a computer aided design part.

16. The method of claim 9 wherein:

said first computer aided design command is related to a viewing function for viewing a computer aided design part.

* * * * *